(12) United States Patent
Cella et al.

(10) Patent No.: US 8,741,442 B2
(45) Date of Patent: Jun. 3, 2014

(54) MODIFIED ELECTRODES USING FUNCTIONAL ORGANIC MATERIALS AND ELECTRONIC DEVICES THEREFROM

(75) Inventors: James Anthony Cella, Clifton Park, NY (US); Christian Maria Anton Heller, Albany, NY (US); Jie Liu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1014 days.

(21) Appl. No.: 11/107,501

(22) Filed: Apr. 15, 2005

(65) Prior Publication Data

US 2006/0234059 A1    Oct. 19, 2006

(51) Int. Cl.
  *H01L 51/54* (2006.01)
(52) U.S. Cl.
  USPC ........... 428/500; 428/461; 428/917; 313/503; 313/504; 313/506; 257/E51.033
(58) Field of Classification Search
  USPC .............................. 428/690, 917; 427/58, 66; 313/502–509; 257/40, 88–103; 257/E51.001–E51.052; 252/301.16–301.35
  See application file for complete search history.

(56) References Cited

U.S. PATENT DOCUMENTS

| | | | | | |
|---|---|---|---|---|---|
| 3,673,572 | A | * | 6/1972 | Sliva et al. ........................ 345/76 |
| 5,281,489 | A | * | 1/1994 | Mori et al. ..................... 428/690 |
| 5,728,801 | A | | 3/1998 | Wu et al. | |
| 5,858,561 | A | * | 1/1999 | Epstein et al. ................. 428/690 |
| 5,998,803 | A | | 12/1999 | Forrest et al. | |
| 6,023,371 | A | | 2/2000 | Onitsuka et al. | |
| 6,392,339 | B1 | * | 5/2002 | Aziz et al. ..................... 313/504 |
| 6,433,115 | B2 | | 8/2002 | Hawker et al. | |
| 6,847,162 | B2 | | 1/2005 | Duggal et al. | |
| 6,861,091 | B2 | | 3/2005 | Sellinger | |
| 2002/0037432 | A1 | | 3/2002 | Park et al. | |
| 2002/0105005 | A1 | * | 8/2002 | Seo et al. ...................... 257/101 |
| 2003/0170490 | A1 | | 9/2003 | Hu et al. | |
| 2004/0051083 | A1 | | 3/2004 | McDonald et al. | |
| 2004/0178408 | A1 | | 9/2004 | McCulloch et al. | |
| 2004/0199016 | A1 | | 10/2004 | Shirota et al. | |
| 2004/0222412 | A1 | * | 11/2004 | Bai et al. .......................... 257/40 |

FOREIGN PATENT DOCUMENTS

| | | | | |
|---|---|---|---|---|
| EP | 1441399 A2 | | 7/2004 | ............. H01L 51/30 |
| JP | 2001-098023 | * | 4/2001 | |
| JP | 20030313240 | | 11/2003 | |
| JP | 2004203828 A2 | | 7/2004 | ................ C07F 9/53 |
| WO | WO 03/032330 A2 | * | 4/2003 | |
| WO | WO2004014528 A1 | | 2/2004 | |
| WO | 2004102690 A2 | | 11/2004 | |
| WO | WO 2005/064702 A | | 7/2005 | |

OTHER PUBLICATIONS

Bellmann et al., "Hole Transport Polymers with Improved Interfacial Contact to the Anode Material," Chemistry of Materials, vol. 12, No. 5, pp. 1349-1353, May 2000.*
Park et al., "Effect of polymer-insulating nanolayers on electron injection in polymer light-emitting diodes," Applied Physics Letters, vol. 84, No. 10, pp. 1783-1785, Mar. 2004.*
Yang Y et al., "Electron Injection Polymer for Polymer Light-Emitting Diodes", Journal of Applied Physics, American Institute of Physics, New York, US, vol. 77, No. 9, May 1, 1995, pp. 4807-4809.
Liu Jie et al., "Efficient Bottom Cathodes for Organic Light-Emitting Devices", Applied Physics Letters, AIP, American Institute of Physics, Melville, NY, US, vol. 85, No. 5, Aug. 2, 2004, pp. 837-839.
Akcelrud, "Electroluminescent Polymers", Progress in Polymer Science, vol. 28, pp. 875-962, 2003.
U. Mitschke, et al "The Electroluminescence of Organic Materials", J. Mater. Chem., vol. 10, pp. 1471-1507, 2000.
Wu, Hongbin, et al., "Efficient Electron Injection from a Bilayer Cathode Consisting of Aluminum and Alcohol-/Water-Soluble Conjugated Polymers", Adv. Mater. 2004, 16, No. 20, Oct. 18, 2004, pp. 1826-1830.
JP2001098023 Abstract, Apr. 10, 2001.
JP2003313240 Abstract, Nov. 6, 2003.
State Intellectual Property Office, P.R. China, English Translation of First Office Action issued on Sep. 16, 2010, pp. 1-4 and pp. 1-7.

* cited by examiner

*Primary Examiner* — Marie R. Yamnitzky
(74) *Attorney, Agent, or Firm* — Mary Louise Stanford (57) ABSTRACT

A surface modified electrode, included in an electronic device comprises an electrode layer, and a functional organic material. The functional organic material comprises an amine-substituted polymeric material which is on the surface of and in contact with the electrode layer. Such surface modified electrodes are useful for producing electronic devices.

4 Claims, 3 Drawing Sheets

MODIFIED ELECTRODES USING FUNCTIONAL ORGANIC MATERIALS AND ELECTRONIC DEVICES THEREFROM

BACKGROUND

The invention relates generally to surface modified electrodes using amine-substituted polymeric materials, and electronic devices produced from the modified electrodes.

Electro-active materials, such as electro-active organic materials are used for producing various types of electronic devices, such as organic light emitting devices (OLEDs), photodetectors, and photovoltaic devices. Generally, the electronic devices, such as OLEDs, require low work function metals, such as calcium, magnesium, and the like to facilitate charge injection into the electro-active materials. A problem with the use of low work function metals is their high reactivity toward ambient air and moisture, which often requires that fabrication and operation of these devices be conducted under hermetic conditions or the devices be rigorously encapsulated. To overcome or alleviate these difficulties, it is desirable to employ less reactive metals such as aluminum, gold, silver, and the like as electrodes. However, due to the considerable mismatch of their Fermi-level to the lowest unoccupied molecular orbital (LUMO) of the state-of-the-art electro-active materials, the less reactive metals lead to less efficient electron injection. As a result, devices employing these less reactive metals as electrode materials generally operate at relatively higher voltages and exhibit poorer quantum and power efficiency. In order to circumvent this problem, various electrode activation methods have been employed. One such method for activating metal electrodes is to insert a layer of insulating materials, such as alkali metal fluorides in between the electro-active material and the less reactive metal electrode. However, the application of the activation layer in the most of state-of-the-art devices can be only achieved via thermal evaporation under high vacuum, and does not lend itself to large area, high throughput processing.

Therefore, there is a need to provide functional organic materials that lower the injection barrier, thereby allowing for efficient charge flow between the electrodes and an adjacent electro-active material and, at the same time, substantially preserving the long-term stability and performance of the device. Further, there is a need for methods for using such functional organic materials for producing modified electrodes, which in turn can be used for making electronic devices, for example.

BRIEF DESCRIPTION

Disclosed herein are functional organic materials, which comprise amine-substituted polymeric materials. The materials are useful for producing surface modified electrodes, which are included in electronic devices. Techniques for producing the surface modified electrodes, and electronic devices that include these surface modified electrodes are also disclosed.

Briefly, one embodiment of the present invention is a surface modified electrode, which is included in an electronic device. The surface modified electrode comprises an electrode layer and a functional organic material disposed on the surface of and in contact with the electrode layer. The functional organic material comprises an amine-substituted polymeric material.

Another embodiment of the present invention is an electronic device having a first conductive layer, a second conductive layer, and an electro-active material layer disposed between the first and second conductive layers. At least one of the first and second conductive layers is modified by a functional organic material, wherein the functional organic material comprises an amine-substituted polymeric material; and further wherein the functional organic material is on the surface of and in contact with at least one of the first and second conductive layers.

Still yet another embodiment of the present invention is a method for fabricating an electronic device. The method includes disposing a layer of a functional organic material on the surface of and in contact with a first conductive layer to form a surface modified electrode, and disposing an electro-active material layer between the surface modified electrode and a second conductive layer. The functional organic material comprises an amine-substituted polymeric material.

A still yet another embodiment of the present invention is a device that has a display unit having a plurality of electronic devices. One or more of the electronic devices has a first and second conductive layers, and an electro-active material layer disposed between the first and second conductive layers. At least one of the first and second conductive layers is modified by a functional organic material, wherein the functional organic material is on the surface of and in contact with at least one of the first and second conductive layers, and comprises an amine-substituted polymeric material.

Yet another embodiment of the present invention is a method of operating an electronic device. The method includes applying an electrical bias or light energy to the electronic device to convert between electrical energy and light energy. The electronic device includes a first and second conductive layers, and an electro-active material layer disposed between the first and second conductive layers. At least one of the first and second conductive layers is modified by an organic functional organic material, which comprises an amine-substituted polymeric material. The functional organic material is on the surface of and in contact with at least one of the first and second conductive layers.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The present invention may be understood more readily by reference to the following detailed description of preferred embodiments of the invention and the examples included therein. In the following specification and the claims which follow, reference will be made to a number of terms which shall be defined to have the following meanings:

The singular forms "a", "an" and "the" include plural referents unless the context clearly dictates otherwise.

"Optional" or "optionally" means that the subsequently described event or circumstance may or may not occur, and that the description includes instances where the event occurs and instances where it does not.

As used herein the term "aliphatic radical" refers to an organic radical having a valence of at least one consisting of a linear or branched array of atoms which is not cyclic. The array of atoms comprising the aliphatic radical may include heteroatoms such as silicon, or may be composed exclusively of carbon and hydrogen. For convenience, the term "aliphatic radical" is defined herein to encompass, as part of the "linear or branched array of atoms which is not cyclic" a wide range of functional groups such as alkyl groups, alkenyl groups, alkynyl groups, halo alkyl groups, conjugated dienyl groups, and the like. For example, the 4-methylpent-1-yl radical is a $C_6$ aliphatic radical comprising a methyl group, the methyl group being a functional group which is an alkyl group. Similarly, the but-1-yl group is a $C_4$ aliphatic radical. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl; difluorovinylidene; trichloromethyl, bromodichloromethyl, bromoethyl, 2-bromotrimethylene (e.g. —$CH_2CHBrCH_2$—), and the like. Further examples of aliphatic radicals include allyl, dimethylisopropylidene (i.e. —$CH_2C(CH_3)_2CH_2$—), methyl (i.e. —$CH_3$), methylene (i.e. —$CH_2$—), ethyl, ethylene, hexyl, hexamethylene, trimethylsilyl ( i.e.$(CH_3)_3Si$—), t-butyldimethylsilyl, vinyl, vinylidene, and the like. By way of further example, a $C_1$-$C_{10}$ aliphatic radical contains at least one but no more than 10 carbon atoms. A methyl group (i.e. $CH_3$—) is an example of a $C_1$ aliphatic radical. A decyl group (i.e. $CH_3(CH_2)_9$—) is an example of a $C_{10}$ aliphatic radical.

As used herein, the term "aromatic radical" refers to an array of atoms having a valence of at least one comprising at least one aromatic group. As used herein, the term "aromatic radical" includes but is not limited to phenyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), naphthyl groups (n=2), anthraceneyl groups (n=3) and the like. The aromatic radical may also include nonaromatic components. For example, a benzyl group is an aromatic radical that comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, and the like.

For example, the 4-methylphenyl radical is a $C_7$ aromatic radical comprising a methyl group, the methyl group being a functional group which is an alkyl group. Aromatic radicals include halogenated aromatic radicals such as trifluoromethylphenyl, hexafluoroisopropylidenebis(4-phen-1-yl) (i.e. —$OPhC(CF_3)_2Ph$), chloromethylphenyl; 3-trichloromethylphen-1-yl (i.e. 3-$CCl_3Ph$-), 4(3-bromoprop-1-yl)phen-1-yl (i.e. $BrCH_2CH_2CH_2Ph$-), and the like. Further examples of aromatic radicals include isopropylidenebis(4-phen-1-yl) (i.e. -$PhC(CH_3)_2Ph$-), 3-methylphen-1-yl, methylenebis (phen-4-yl) (i.e. -$PhCH_2Ph$-), 2-ethylphen-1-yl, phenylethenyl, hexamethylene-1,6-bis(phen-4-yl) (i.e. -$Ph(CH_2)_6Ph$-); 3-trimethylsilylphen-1-yl, 4-t-butyldimethylsilylphenl-1-yl, 4-vinylphen-1-yl, vinylidenebis(phenyl), and the like. The benzyl radical ($C_7H_8$—) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2$—) is a cycloaliphatic radical that comprises a cyclohexyl ring (the array of atoms which is cyclic but which is not aromatic) and a methylene group (the non-cyclic component). The cycloaliphatic radical may include heteroatoms such as silicon, or may be composed exclusively of carbon and hydrogen. For convenience, the term "cycloaliphatic radical" is defined herein to encompass a wide range of fumctional groups such as alkyl groups, alkenyl groups, alkynyl groups, halo alkyl groups, conjugated dienyl groups, and the like. For example, the 4-methylcyclopent-1-yl radical is a $C_6$ cycloaliphatic radical comprising a methyl group, the methyl group being a functional group which is an alkyl group. A cycloaliphatic radical may comprise one or more halogen atoms, which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene2,2-bis (cyclohex-4-yl) (i.e. —$C_6H_{10}C(CF_3)_2C_6H_{10}$—), 2-chloromethylcyclohex-1-yl; 3-difluoromethylenecyclohex-1-yl; 4-2-bromoethylcyclopent-1-yl, 2-bromopropylcyclohex-1-yl ($CH_3CHBrCH_2C_6H_{10}$—), and the like. Further examples of cycloaliphatic radicals include 4-allylcyclohex-1-yl, 2,2-isopropylidenebis(cyclohex-4-yloxy) (i.e. —$C_6H_{10}C(CH_3)_2C_6H_{10}$—), 3-methylcyclohex-1-yl, methylenebis(cyclohex-4-yl) (i.e. —$C_6H_{10}CH_2C_6H_{10}$—), 1-ethylcyclobut-1-yl, cyclopropylethenyl, hexamethylene-1,6-bis(cyclohex-4-yl) (i.e. —$C_6H_{10}(CH_2)_6C_6H_{10}$—);4-methylcyclohex-1-yl (i.e. 4-$CH_3C_6H_{11}$—), 3-trimethylsilylcyclohex-1-yl, 2-t-butyldimethylsilylcyclopent-1-yl, 4-vinylcyclohexen-1-yl, vinylidenebis(cyclohexyl), and the like. The term "a $C_3$-$C_{10}$ cycloaliphatic radical" includes cycloaliphatic radicals containing at least three but no more than 10 carbon atoms. The cycloaliphatic radical silacyclopentyl ($C_4Si(R)_2H_7O$—) represents a $C_4$ cycloaliphatic radical. The cyclohexylmethyl radical ($C_6H_{11}CH_2$—) represents a $C_7$ cycloaliphatic radical.

As used herein, the amine substituent is meant to include a primary, secondary, or a tertiary amine. Secondary amine substituents have a general formula $NHR^1$, wherein $R^1$ is a $C_1$-$C_{30}$ aliphatic radical, $C_3$-$C_{30}$ aromatic radical, or a $C_3$-$C_{30}$ cycloaliphatic radical. Tertiary amine substituents have a general formula $NR^1R^2$, where $R^1$ and $R^2$ are independently a $C_1$-$C_{30}$ aliphatic radical, a $C_3$-$C_{30}$ aromatic radical, or a $C_3$-$C_{30}$ cycloaliphatic radical.

One aspect of the present invention is a surface modified electrode, which is included in an electronic device. The electrode comprises an electrode layer and a functional organic material disposed on the electrode layer. The functional organic material comprises an amine-substituted polymeric material. The electrode layer is comprised of conductive materials, which comprise at least a metal (such as Al, Ag, Au, etc.), metal oxide (such as indium tin oxide, tin oxide, indium zinc oxide, etc) conductive organic materials (such as PEDOT:PSS), or any combinations thereof.)

The amine-substituted polymeric material may be a homopolymer, copolymer (random or block copolymer), or any combinations thereof. In an embodiment, the amine-substituted polymeric material may have at least one amine group. Further, the amine group may be present either in the repeat units of the polymeric material, and/or the terminal group(s) of the polymeric material. Functional organic materials include polymeric and non-polymeric organic materials. Non-polymeric materials having amine substituent(s) advantageously include materials having an adequately high molecular weight and a sufficiently low volatility so as to permit their use in producing electronic devices.

The amine-substituted polymeric materials generally include a polymer structure and at least one amine substituent. The polymer structure may be conjugated or non-conjugated, and can be derived from vinyl monomers (example, poly(alpha-olefin)s, poly(alkenylaromatic)s), or monomers other than vinyl monomers, such as diols, diacids, diamines, and the like. In an embodiment, the amine-substituted polymer structure comprises one of poly(alpha-olefin)s, poly(alkenylaromatic)s, polyphenylenes, polycarbonates, polyimides, polyesters or copolymers and blends thereof. Exemplary poly(alpha-olefins and poly(alkenylaromatics) include structural units having structure (I),

Structure I wherein $Q^1$ may be an aliphatic, cycloaliphatic, or aromatic group comprising at least one amine substituent. The amine substituent can be present on the aliphatic, cycloaliphatic, or aromatic group. Non-limiting examples of amine-substituted polymeric materials having structural units having structure (I) include poly(3-vinyl-1,1'-binaphthalene), poly(2-vinyl-1,1'binaphthalene), poly(2-vinylnaphthalene-styrene) copolymer, polyfluorene, and the like.

In another embodiment, the functional organic materials have structural units derived from vinyl(biphenyl) compounds and bearing at least one amine substituent. Non-limiting examples of such materials include amine-substituted poly(4-vinyl-1,1'-biphenyl), poly(3-vinyl-1,1'-biphenyl), and the like.

In other embodiments, the functional organic material having at least one amine substituent includes structural units derived from at least one polymerizable monomer. Exemplary polymerizable monomers include, but are not limited to vinyl monomers having carbocyclic groups that have at least one amine substituent, or heterocyclic groups that may or may not contain other organic groups possessing at least one amine substituent. Non-limiting examples of suitable vinyl monomers include vinyl naphthalene, styrene, vinyl anthracene, vinyl pentacene, (1,4-diethynyl)aromatics such as (1,4-diethynyl)benzene, and vinyl chrysene that are substituted with amine substituents; and vinyl carbazole, vinyl quinoline, vinyl bipyridyl, vinyl thiophene, and vinyl pyridine, and so forth. Combinations of the foregoing polymerizable vinyl monomers may also be used. Further, the polymerizable monomer may include one or more crosslinkable groups, such as, for example, vinyl groups, allyl groups, styryl groups, and alkynyl groups, each of which may further include at least one amine substituent.

In another embodiment, the amine-substituted polymeric material includes a repeat unit having a structure (II) listed below.

Structure (II)

In the embodiment having structure (II), [A] is an aromatic radical, [B] is a single bond or a spacer group, $R^1$ and $R^2$ comprise independently of each other hydrogen atom, $C_1$-$C_{30}$ aliphatic radicals, $C_3$-$C_{30}$ cycloaliphatic radicals, $C_3$-$C_{30}$ aromatic radicals, or any combination thereof, and "p" is an integer from 1 to the maximum number of positions available for substitution on [A]. Examples of aromatic radicals [A] include phenylene, biphenylene, terphenylene, fluorenylene, naphthylene, anthracenylene, phenanthrenylene, chrysylene, pentacylene, and the like.

The spacer groups are exemplified by alkylene groups, arylene groups, and combinations having alkylene and arylene groups, and the like. The spacer group can also be alkylene, cycloalkylene or cycloalkylidene, or arylene groups, and so on. In an embodiment, the spacer groups may also include heteroatoms, such as oxygen, sulfur, nitrogen, or phosphorus atoms. Examples of spacer groups include $C_1$ to $C_{12}$ alkylene groups, such as methylene, ethylene, propylene, butylene, cyclohexylene, and cyclohexylidene, as well as alkyleneoxy groups, such as for example, methyleneoxy, ethyleneoxy, propyleneoxy, cyclohexyleneoxy, and polyalkyleneoxy; and the like.

In an embodiment, the amine-substituted polymeric material has a structure (II) wherein the $NR^1R^2$ group is one of dialkylamino, monoalkylamino, $NH_2$ groups, or any combinations thereof; and [A] is a phenylene group. In yet another embodiment, when $NR^1R^2$ group is one of dialkylamino group, monoalkylamino, $NH_2$ groups, or any combinations thereof, and [A] is a phenylene group, then [B] is a methylene group.

Polystyrene-based amine-substituted functional organic materials are generally beneficial because they are relatively easy to prepare. Thus, in an embodiment, the functional organic materials of this class may include repeat units having a general structure (III).

Structure (III)

The [B] in structure (III) may be a single bond or a spacer group, or combinations thereof; and $R^1$ and $R^2$ comprise independently of each other hydrogen atoms, $C_1$-$C_{30}$ aliphatic radicals, $C_3$-$C_{30}$ cycloaliphatic radicals, $C_3$-$C_{30}$ aromatic radicals, or any combination thereof.

Polystyrene-based functional polymeric materials, wherein [B] is a methylene group, are desirable because they generally can be easily prepared. For example, poly(4-chloromethyl)styrene that is commercially available can be reacted with an amine-based nucleophile, such as $NHR^1R^2$ or $(NR^1R^2)$-$M^+$, wherein $R^1$ and $R^2$ are as described previously, and M is a metal. Non-limiting examples of metal "M" includes alkali metals such as lithium, sodium, and potassium. Displacement of the chlorine group in the chloromethyl group results in formation of polymeric materials having structure (III). Since a wide variety of amine nucleophiles can be used, a large class of amine-substituted polymeric compounds suitable as functional organic materials for producing the modified electrodes and electronic devices can be prepared. In an embodiment, a suitable amine-substituted polymeric material is at least one of poly[(N,N-dibutylaminomethyl)styrene], poly[(N,N-dimethylaminomethyl)styrene], poly[(N,N-dipropylaminomethyl)styrene], poly[(N,N-ethylmethylaminomethyl)styrene], or poly[(N,N-diethylaminomethyl)styrene]. In another embodiment, modified electrodes comprising the amine-substituted polystyrenes, in combination with a transparent electrode, such as those comprising indium tin oxide are particularly useful for producing transparent electronic devices.

The functional organic material may also include structural units derived from at least one organosilicon hydride, wherein the organosilicon hydride comprises at least one organosilane group having a Si—H bond. The organosilicon hydrides may further possess at least one amine substituent. When organosilicon hydrides containing more than one Si—H bond are used, such as organosilicon dihydrides and organosilicon trihydrides, cross-linked amine-substituted polymeric materials may result. In an embodiment, the amine-substituted polymeric materials comprising at least one dipolar moiety include structural units derived from at least one organosilicon hydride of structures IV, V, or VI.

Structure IV

Structure V

Strucuture VI

In a specific embodiment, the amine-substituted polymeric material has structural units derived from at least one organosilicon hydride, such as $(CH_3)_2Si(H)O$—$[Si(CH_3)_2O]_x$—$Si(CH_3)_2(H)$, and $(CH_3)_3SiO$—$[SiCH_3(H)O]_x$—$[Si(CH_3)_2O]_y$—$Si(CH_3)_3$, wherein "x" and "y" independently have values from about 1 to about 30.

The functional organic materials disclosed above can be used for producing modified electrodes. Thus, in an embodiment of the present invention, a coating composition having at least one functional organic material comprising an amine-substituted polymeric material and at least one solvent is applied as a coating on an electrode surface using techniques known in the art. Polar solvents are generally beneficial because they typically dissolve the amine-substituted polymeric materials. Non-limiting examples of polar solvents include aliphatic alcohols, such as methanol, ethanol, n-propanol, isopropanol, n-butanol, isobutanol, n-pentanol, and the like. In an embodiment, the modified electrode thus obtained can be used in producing electronic devices, such as for example, EL devices, photovoltaic (PV) devices, sensors, electrochromic devices, and field effect transistors and so on.

Figure 1:
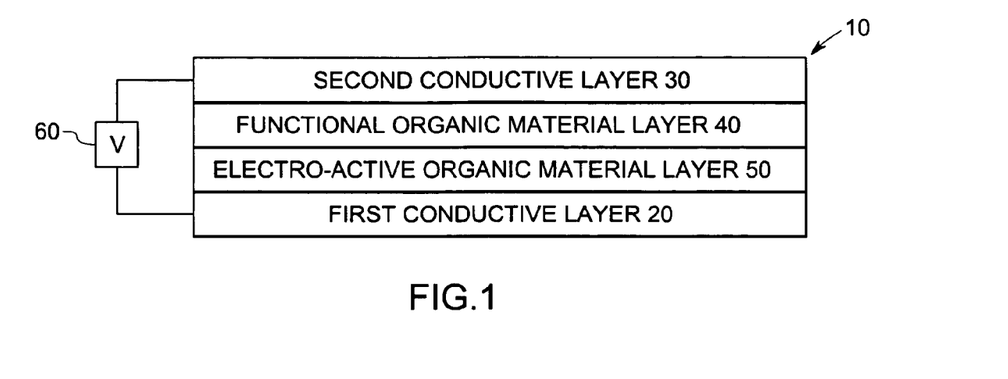
FIG. 1 is a schematic representation of a first electronic device structure having a layer of a functional organic material, which comprises an amine-substituted polymeric material in accordance with embodiments of the present invention.

One embodiment of a useful electronic device is illustrated in FIG. 1, which shows a first electronic structure device 10, comprising a functional organic material layer 40, which comprises an amine-substituted polymeric material such that the amine-substituted polymeric material is on the surface of and is in contact with a second conductive layer 30, and an electro-active material layer 50 disposed between a first conductive layer 20 and the second conductive layer 30. Application of a voltage 60 between the first and second conductive layers is required to operate the device.

Figure 2:
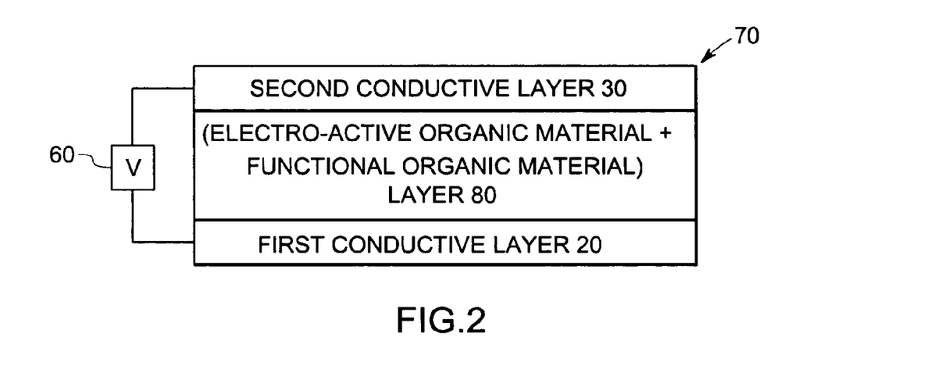
FIG. 2 is a schematic representation of a second electronic device structure having a mixed layer of an electro-active material and a functional organic material, which comprises an amine-substituted polymeric material in accordance with embodiments of the present invention.

In another embodiment, the electro-active layer can also include a combination of an electro-active material and the functional organic material comprising an amine-substituted polymeric material. This embodiment is illustrated in FIG. 2, which shows a second electronic device structure 70, comprising a combined (electro-active material and functional organic material) layer 80 disposed between a first conductive layer 20 and a second conductive layer 30, such that the combined layer 80 is on the surface of and in contact with at least one of the first and second conductive layers. By having a substantially intimate mixture of the electro-active material and the functional organic material, the functional organic material will be better able to transfer charge (such as electrons from a cathode), thereby potentially increasing the efficiency of the electro-optic device, as compared with a device having these two types of materials as separate layers.

Figure 3:
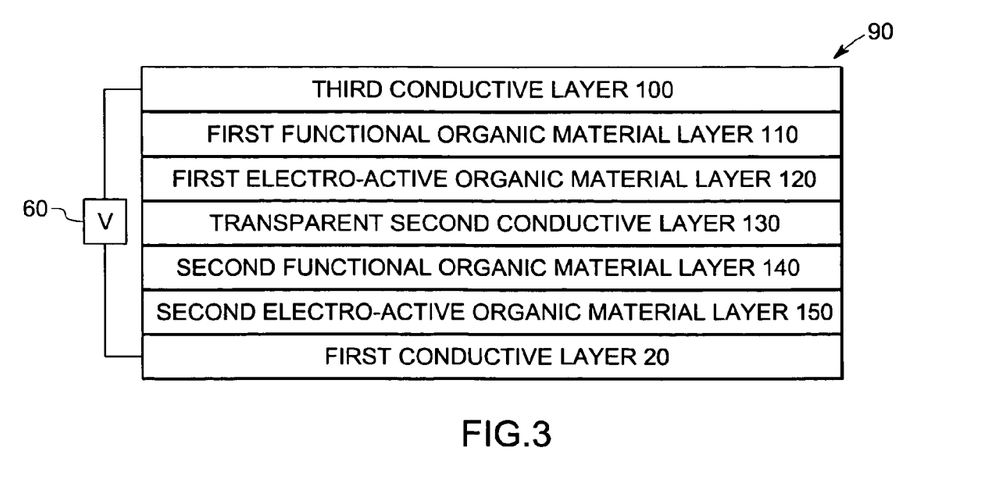
FIG. 3 is a schematic representation of a third electronic device structure having a first functional organic material layer and a second functional organic material layer, in accordance with embodiments of the present invention.

Various configurations may be implemented by constructing stacked devices having more than one functional organic material layers, more than one electro-active layers, and more than two conductive layers, and so forth. In some cases, one or more of the conductive layers may be transparent. In general, with an appropriate combination of the various layers, the electronic device either shows enhanced performance or meets specifications for various applications. FIG. 3 shows one such embodiment of a stacked/tandem device 90 (third electronic device structure), which comprises from bottom to top, a first conductive layer 20, a second electro-active material layer 150, a second functional organic material layer 140, a transparent second conductive layer 130, a first electro-active material layer 120, a first functional organic material layer 110, and a third conductive layer 100. In FIG. 3, the first functional organic material layer 110 is on the surface of and in contact with the third conductive layer 100, and the second functional organic material 140 is on the surface of and in contact with the transparent second conductive layer 130. In other embodiments, materials for the layers 110 and 120 may be chosen such that the combination of the layers 100-130 represents an OLED or an electrochromic device. Similarly, materials for the layers 140 and 150 may be suitably selected such that the combination of the layers 130, 140, 150, and 20 represents an OLED or an electrochromic device. Therefore these features enable the construction of stacked devices 90 comprising a combination of an OLED and an electrochromic device in an embodiment, and a combination of two OLEDs in another embodiment. Such techniques can facilitate the construction of specialized devices, such as for example, a color-tunable illumination source, which can be formed by a combination of an Electro-active material layer and an electrochromic device; a sensor, a field effect transistor, or any combination thereof.

Figure 4:
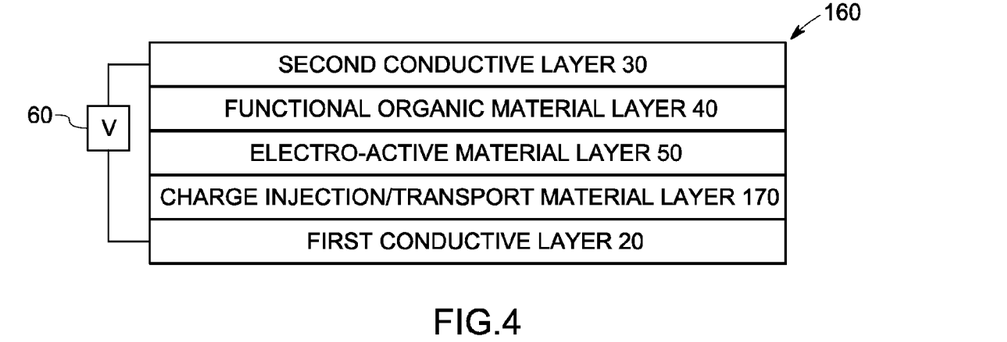
FIG. 4 is a schematic representation of a fourth electronic device structure having a charge injection/transport material layer and a functional organic material, which comprises an amine-substituted polymeric material layer in accordance with embodiments of the present invention.

Still further examples and varieties of stacked electronic devices that use the functional organic materials of the invention and modified electrodes made thereof may also comprise a charge transport layer, a charge injection layer, or combinations thereof as additional layers. Another combination involving a charge transport layer and a hole transport layer may also be used. FIG. 4 is a schematic representation of a fourth electronic device structure 160 including from bottom to top, a first conductive layer 20, a charge injection/transport material layer 170, an electro-active material layer 50, a functional organic material layer 40, and a second conductive layer 30. In this device structure, the functional organic material layer 40 is on the surface of and in contact with the second conductive layer 30.

The functional organic materials comprising the amine-substituted polymeric materials disclosed herein generally facilitate charge injection from an electron donor layer into an electro-active (or electroluminescent) material, thus facilitating the preparation of electronic display devices, for example. In one embodiment, the functional organic material can be incorporated into an electronic device to enhance the electron transport from or to an electrode. For example, an organic electroluminescent ("EL") device can benefit from a functional organic material of the present invention, such as one of the materials disclosed above, which material is disposed between the cathode and the organic electroluminescent material of the device, such that the material is on the surface of and in contact with the cathode. The electro-active organic material emits light when a voltage is applied across the electrodes. The functional organic material can form a distinct interface with the electro-active organic material, or a continuous transition region having a composition changing from a substantially pure functional organic material to a substantially pure electro-active organic material. In an embodiment, the functional organic material can be deposited on an underlying material, such as an electrode surface, by a method including spin coating, spray coating, dip coating, roller coating, ink-jet printing, gravure coating techniques, physical vapor deposition, etc.

The anode of an organic EL device generally includes a material having a high work function, e.g., greater than about 4.4 electron volts. Indium tin oxide (ITO) is typically used for this purpose because it is substantially transparent to light transmission and thus facilitates light emitted from electro-active organic layer to escape through the ITO anode layer without being significantly attenuated. The term "substantially transparent" means allowing at least 50 percent, commonly at least 80 percent, and more commonly at least 90 percent, of light in the visible wavelength range transmitted through a film having a thickness of about 0.5 micrometer, at an incident angle of less than or equal to 10 degrees. Other materials utilized as the anode layer may include tin oxide, indium oxide, zinc oxide, indium zinc oxide, zinc indium tin oxide, antimony oxide, and mixtures thereof.

In construction, the anode layer may be deposited on the underlying element by physical vapor deposition, chemical vapor deposition, or sputtering, and other processes. The thickness of an anode having electrically conducting oxide, such as those listed above, are generally in the range from about 10 nanometers to about 500 nanometers in an embodiment, from about 10 nanometers to about 200 nanometers in another embodiment, and from about 50 nanometers to about 200 nanometers in still another embodiment. A thin, substantially transparent layer of a metal, for example, having a thickness of less than about 50 nanometers, can also be used as a suitable conducting layer. Generally, metals utilized for the anode are those having a relatively high work function, such as greater than about 4.4 electron volts, for example. Such exemplary metals include silver, copper, tungsten, nickel, cobalt, iron, selenium, germanium, gold, platinum, aluminum, or mixtures thereof or alloys thereof. In one embodiment, the anode is disposed on a substantially transparent substrate, such as one constructed of glass or a polymeric material.

In general, the cathode injects negative charge carriers (electrons) into the electro-active organic layer. In an embodiment, the cathode materials are metals, such as K, Li, Na, Cs, Mg, Ca, Sr, Ba, Al, Ag, Au, In, Sn, Zn, Zr, Sc, Y, elements of the lanthanide series, alloys thereof, or mixtures thereof. Suitable alloy materials for the manufacture of cathode layer are Ag—Mg, Al—Li, In—Mg, and Al—Ca, Al—Au alloys. Layered non-alloy structures are also feasible, such as a thin layer of a metal such as calcium, or a non-metal, such as LiF, covered by a thicker layer of some other metal, such as aluminum or silver. The cathode may be deposited on the underlying element by physical vapor deposition, chemical vapor deposition, or sputtering.

Further, the electro-active organic layer may serve as the transport medium for both holes and electrons. In this electro-active organic layer, the excited species may combine and drop to a lower energy level, concurrently emitting EM radiation in the visible range. Electro-active organic materials are typically chosen to electroluminesce in the desired wavelength range.

The thickness of the electroactive layer is generally maintained in the exemplary range of about 10 nanometers to about 300 nanometers. The electro-active material may be an organic material, such as a polymer, a copolymer, a mixture of polymers, or lower molecular-weight organic molecules having unsaturated bonds, and so on. Such materials generally possess a delocalized 7l-electron system, which typically enables the polymer chains or organic molecules to support positive and negative charge carriers with relatively high mobility. Common electro-active polymers are: poly(n-vinylcarbazole) ("PVK", emitting violet-to-blue light in the wavelengths of about 380-500 nanometers) and its derivatives; polyfluorene and its derivatives such as poly(alkylfluorene), for example poly(9,9-dihexylfluorene) (410-550 nanometers), poly(dioctylfluorene) (wavelength at peak EL emission of 436 nanometers) or poly{9,9-bis(3,6-dioxaheptyl)-fluorene-2,7-diyl} (400-550 nanometers); poly (paraphenylene) ("PPP") and its derivatives such as poly(2-decyloxy-1,4-phenylene) (400-550 nanometers) or poly(2,5-diheptyl-1,4-phenylene); poly(p-phenylene vinylene) ("PPV") and its derivatives such as dialkoxy-substituted PPV and cyano-substituted PPV; polythiophene and its derivatives such as poly(3-alkylthiophene), poly(4,4'-dialkyl-2,2'-bithiophene), poly(2,5-thienylene vinylene); poly(pyridine vinylene) and its derivatives; polyquinoxaline and its derivatives; and polyquinoline and its derivatives. Mixtures of these polymers or copolymers may be based on one or more of these polymers and others that may be used to tune the color of emitted light, for example.

Another class of exemplary electro-active materials is polysilanes. Polysilanes are linear silicon-backbone polymers substituted with a variety of alkyl and/or aryl side groups.

They are quasi one-dimensional materials with delocalized sigma—conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane}, and the like. These polysilanes generally emit light having wavelengths in the range from about 320 nanometers to about 420 nanometers.

Organic materials having molecular weight less than, for example, about 5000 that are made of a large number of aromatic units are also applicable as Electro-active materials. An example of such materials is 1,3,5-tris{n-(4-diphenylaminophenyl)phenylamino}benzene, which emits light in the wavelength range of 380-500 nanometers. The electro-active organic layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nanometers. Still other advantageous materials are the low molecular-weight metal organic complexes such as aluminum-, gallium-, and indium-acetylacetonate, which emit light in the wavelength range of 415-457 nanometers, aluminum-(picolymethylketone)-bis{2,6-di(t-butyl)phenoxide} or scandium-(4-methoxy-picolylmethylketone)-bis (acetylacetonate), which emits in the range of 420-433 nanometers. For white light application, beneficial electroactive organic materials are those that emit light in the blue-green wavelengths, for example.

Other electro-active organic materials that emit in the visible wavelength range and that may be employed with the present technique are organometallic complexes of 8-hydroxyquinoline, such as tris(8-quinolinolato)aluminum and other materials disclosed in U. Mitschke and P. Bauerle, "The Electroluminescence of Organic Materials," J. Mater. Chem., Vol. 10, pp. 1471-1507 (2000), which is incorporated herein by reference. Additional exemplary organic materials that may be employed in the EL layer of the present invention include those disclosed by Akcelrud in "Electroluminescent Polymers", Progress in Polymer Science, Vol 28 (2003), pp. 875-962, which is also incorporated herein by reference. These materials may include polymeric materials whose structures comprise various combinations of structures or structural units that are known in the art to be, or expected to be, electro-active, together with structures that are either known or are potentially expected to perform other functions that enhance device performance, such as hole transport, electron transport, charge transport, and charge confinement, and so forth.

It should be noted that more than one electro-active organic layer may be formed successively, one on top of another. Each layer may have a different electro-active organic material that emits in a different wavelength range.

Furthermore, one or more additional layers may be included in the light-emitting device to further increase the efficiency of the exemplary EL device. For example, an additional layer can serve to improve the injection and/or transport of positive charges (holes) into the EL layer. The thickness of each of these layers is typically kept below 500 nanometers, commonly below 100 nanometers. Exemplary materials for these additional layers are low-to-intermediate molecular weight (for example, less than about 2000) organic molecules, poly(3,4-ethylenedioxythipohene) doped with polystyrenesulfonic acid ("PEDOT:PSS"), and polyaniline, to name a few. They may be applied during the manufacture of the device by conventional methods such as spray coating, dip coating, or physical or chemical vapor deposition, and other processes. In one embodiment of the present invention, a hole injection enhancement layer is introduced between the anode layer and the EL layer to provide a higher injected current at a given forward bias and/or a higher maximum current before the failure of the device. Thus, the hole injection enhancement layer facilitates the injection of holes from the anode. Exemplary materials for the hole injection enhancement layer are arylene-based compounds, such as those disclosed in U.S. Pat. No. 5,998,803, which is incorporated herein by reference. Particular examples include 3,4,9,10-perylenetetra-carboxylic dianhydride and bis(1,2,5-thiadiazolo)-p-quinobis(1, 3-dithiole).

The exemplary EL device may further include a hole transport layer disposed between the hole injection enhancement layer and the EL layer. The hole transport layer transports holes and blocks the transportation of electrons so that holes and electrons are substantially optimally combined in the EL layer. Exemplary materials for the hole transport layer may include triaryldiamine, tetraphenyldiamine, aromatic tertiary amines, hydrazone derivatives, carbazole derivatives, triazole derivatives, imidazole derivatives, oxadiazole derivatives having an amino group, and polythiophenes, to name a few.

In other embodiments, the exemplary EL device may further include an "electron injecting and transporting enhancement layer" as an additional layer, which can be disposed between the electron-donating material and the EL layer. Typical materials utilized for the electron injecting and transporting enhancement layer may include metal organic complexes, such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, and so on.

In an embodiment, the electro-active material may also be co-mingled with a polymeric material that can serve as a matrix polymer. Generally, any of the known polymeric materials may be used.

The electro-active material may further include at least one of a fluorescent dye or a phosphorescent dye. The light-emitting device can further comprise one or more photoluminescent ("PL") layers, having at least a fluorescent layer and/or a phosphorescent layer, such as, for example those disclosed in U.S. Pat. No. 6,847,162.

The surface modified electrode produced as described earlier in this disclosure are valuable for forming electronic devices, such as an organic photovoltaic device, a photodetector, a display device, and an organic light emitting device. Display devices are exemplified by devices used for producing signage. Thus in an embodiment, the surface modified electrodes are useful for making devices comprising a display unit, wherein the display unit comprises a plurality of electronic devices. These electronic devices generally include a first conductive layer, a second conductive layer, and an electro-active material layer disposed between these first and second conductive layers. Typically, at least one of the first and second conductive layers is modified by the functional organic material of the invention. In an embodiment, at least one of the first or second conductive layers may be transparent. By a transparent electrode is meant an electrode having a percent light transmission of greater than or equal to about 90 percent in an embodiment, and greater than or equal to 95 percent in another embodiment. Another type of electronic devices that can benefit from an efficient transport of electrons across an interface between an electrode and an adjacent EL—active material, are photovoltaic ("PV") cells.

Still another embodiment of the present invention encompasses a method for operating an electronic device. The method includes applying an electrical field or light energy to the electronic device to convert between electrical energy and light energy. In this exemplary method, the electronic device has a first conductive layer, a second conductive layer, and an electro-active material layer disposed between the first and second conductive layers. At least one of the first and second conductive layers is modified by the functional organic material of the invention so as to be on the surface of and in contact with at least one of the first and the second conductive layers.

EXAMPLES

The following examples are set forth to provide those of ordinary skill in the art with a detailed description of how the methods claimed herein are evaluated, and are not intended to limit the scope of what the inventors regard as their invention.

Example 1

Preparation of poly[(N,N-ethylmethylaminomethyl)styrene (PEMAMS). A solution of an isomeric mixture of poly (3-chloromethyl)styrene and poly(4-chloromethylstyrene) (2 grams, 13.2 millimoles) and N-methylethylamine (11.8 grams, 200 millimoles) in 25 milliliters of toluene was stirred at room temperature for 5 days. The reaction mixture, which was a slurry containing precipitated solids was transferred to a separatory funnel and diluted with toluene. The organic phase was washed twice with 1 weight percent aqueous NaOH solution, twice with water, and the solvent was removed under vacuum. The tacky, white solid residue was dissolved in methanol and precipitated into water in a blender. The collected solid was air-dried, and then dried in a vacuum oven at 50° C. to afford the final product, which had a glass transition temperature of about ambient temperature.

Examples 2 and 3

The procedure described above was repeated using di(n-butyl)amine and diethylamine to furnish the corresponding poly(N,N-dibutylaminomethyl)polystyrene (PDBAMS), and poly(N,N-diethylaminomethyl)polystyrene (PDEAMS), respectively. UV-visible spectral measurements of thin films of those materials indicated that they were essentially transparent and had no absorption in the visible range (300-800 nanometers). These materials had glass transition temperatures above ambient temperatures.

The following electroluminescent devices were prepared using the green light-emitting polymer, poly[(9,9-di-n-hexylfluorenyl-2,7'-diyl)-co-(1,4-benzo [2,1,3]thiodiazole] (hereinafter abbreviated as LEP), which was purchased from H.W. Sands Corp., Jupiter, Florida: Device 1—ITO/PEDOT/LEP/Al (designated as Comparative Example 1); Device 2—ITO/PEDOT/LEP/Ca—Al (designated as Comparative Example 2); and Device 3—ITO/PEDOT/LEP/PEMAMS-Al (designated as Example 3).

Example 4

Figure 5:
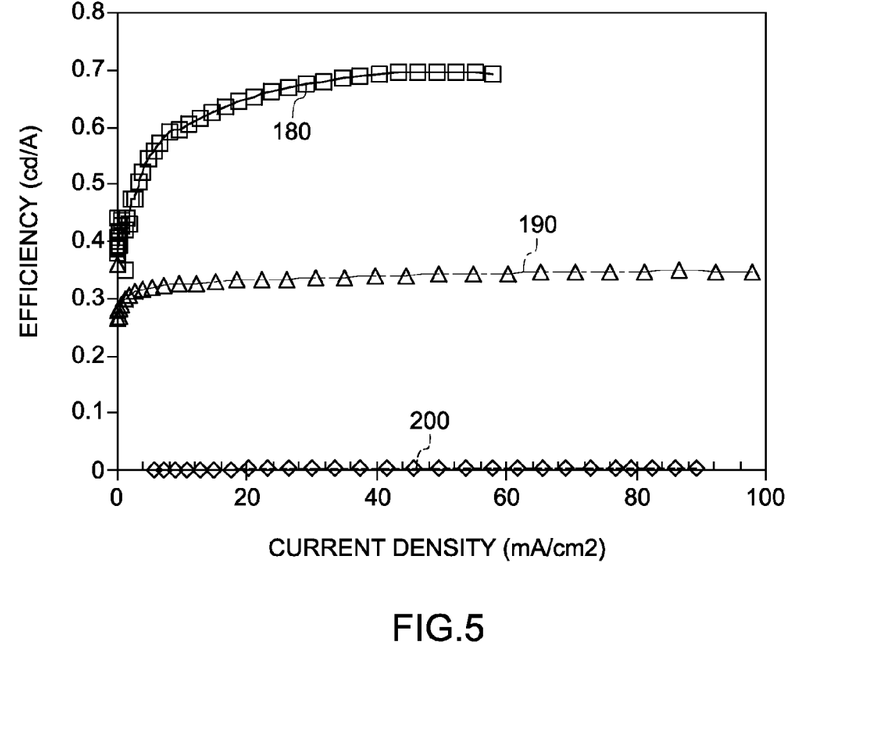
FIG. 5 is a graphical plot of efficiency measured in candela per ampere versus current density for exemplary electronic devices 1, 2, and 3 in accordance with an example of the present invention.

General procedure for the preparation of Electronic Devices. Glass pre-coated with ITO, pre-treated with UV-ozone was used as the substrate. An approximately 60 nanometer thick layer of PEDOT (poly(3,4-ethylenedioxythiophene)) was deposited on the ITO layer by spin-coating techniques, followed by baking at 180° C. in air for an hour. Then a 30-65 nanometer thick layer of LEP was deposited by spin-coating from a xylene solution of LEP. Where needed, the PEMAMS layer was deposited as a layer on the LEP layer by spin coating techniques using an n-butanol solution of the PEMAMS, followed by deposit of the cathode layer. The appropriate cathode layer (Al for Comparative Example 1, a 35 nm Ca layer deposit followed by Al for Comparative Example 2, and Al for Example 3) was then deposited using thermal evaporation at a base vacuum of $2 \times 10^{-6}$ torr. Finally, another glass slide was used to seal the device using optical adhesive. The efficiency of each of devices 1-3 was measured by applying a voltage between the cathode and the anode. A plot of current density (measured in milliamperes per square centimeter, $mA/cm^2$) versus efficiency (measured in candela per ampere, cd/A) was obtained for each device.

The efficiency of the electronic device 3 of Example 3 is considerably greater than that of device 2, which used a Ca—Al electrode, and far greater than that of device 1, which used a bare Al electrode. This shows that electron injection from the poly(N,N-methylethylaminomethyl)styrene—modified Al electrode, wherein the amine-substituted polymeric material is on the surface of and in contact with the Al electrode, is better than from a bare Al electrode.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electronic device comprising:
 a first conductive layer;
 a second conductive layer; and
 an electroluminescent material layer disposed between the first and second conductive layers, wherein the first conductive layer is a cathode and the second conductive layer is an anode;
 a hole injection enhancement layer disposed between the anode and the electroluminescent material layer;
 a functional organic material comprising an amine-substituted polymeric material, wherein the functional organic material is disposed between the electroluminescent material layer and the cathode and modifies the cathode; and
 wherein the amine-substituted polymeric material comprises a repeat unit of structure IV:

Structure (IV)

wherein $R^1$ and $R^2$ are independently of each other, a $C_1$-$C_{30}$ unsubstituted alkyl, phenyl, or any combination thereof.

2. The electronic device of claim 1, wherein at least one of the first and second conductive layers is substantially transparent.

3. The electronic device of claim 1, wherein the electroluminescent material layer comprises at least one of a fluorescent dye or a phosphorescent dye.

4. The electronic device of claim 1, wherein the amine-substituted polymeric material is poly[(N,N-dibutylaminomethyl)styrene], poly[(N,N-dimethylaminomethyl)styrene], poly[(N,N-dipropylaminomethyl)styrene], poly[(N,N-ethylmethylaminomethyl)styrene], or poly[(N,N-diethylaminomethyl)styrene].

* * * * *